(12) United States Patent
Bauer et al.

(10) Patent No.: US 7,749,797 B2
(45) Date of Patent: Jul. 6, 2010

(54) SEMICONDUCTOR DEVICE HAVING A SENSOR CHIP, AND METHOD FOR PRODUCING THE SAME

(75) Inventors: Michael Bauer, Nittendorf (DE); Alfred Haimerl, Sinzing (DE); Angela Kessler, Regensburg (DE); Joachim Mahler, Regensburg (DE); Wolfgang Schober, Amberg (DE)

(73) Assignee: Infineon Technologies AG, Neubiberg (DE)

( * ) Notice: Subject to any disclaimer, the term of this patent is extended or adjusted under 35 U.S.C. 154(b) by 118 days.

(21) Appl. No.: 11/574,861

(22) PCT Filed: Aug. 18, 2005

(86) PCT No.: PCT/DE2005/001453

§ 371 (c)(1),
(2), (4) Date: Sep. 29, 2008

(87) PCT Pub. No.: WO2006/026951

PCT Pub. Date: Mar. 16, 2006

(65) Prior Publication Data

US 2009/0026558 A1    Jan. 29, 2009

(30) Foreign Application Priority Data

Sep. 7, 2004    (DE) .................. 10 2004 043 663

(51) Int. Cl.
*H01L 21/00* (2006.01)
*H01L 21/48* (2006.01)
*H01L 31/0203* (2006.01)
*H01L 23/28* (2006.01)

(52) U.S. Cl. .............. 438/64; 438/127; 257/433; 257/787; 257/E23.116

(58) Field of Classification Search .............. None
See application file for complete search history.

(56) References Cited

U.S. PATENT DOCUMENTS

| | | | | |
|---|---|---|---|---|
| 3,885,304 A | * | 5/1975 | Kaiser et al. | 29/832 |
| 5,173,766 A | * | 12/1992 | Long et al. | 257/687 |
| 5,243,756 A | * | 9/1993 | Hamburgen et al. | 29/841 |
| 5,389,738 A | * | 2/1995 | Piosenka et al. | 174/528 |
| 5,686,698 A | * | 11/1997 | Mahadevan et al. | 174/522 |
| 5,907,190 A | * | 5/1999 | Ishikawa et al. | 257/795 |
| 6,121,675 A | | 9/2000 | Fukamura et al. | |
| 6,260,417 B1 | | 7/2001 | Watanabe et al. | |
| 6,483,030 B1 | * | 11/2002 | Glenn et al. | 174/521 |
| 6,696,753 B2 | * | 2/2004 | Tokuhara | 257/692 |
| 6,821,822 B1 | * | 11/2004 | Sato | 438/127 |
| 6,841,412 B1 | * | 1/2005 | Fisher et al. | 438/106 |

(Continued)

FOREIGN PATENT DOCUMENTS

DE    42 38 113    5/1994

(Continued)

*Primary Examiner*—Scott B Geyer
(74) *Attorney, Agent, or Firm*—Dicke, Billig & Czaja, PLLC

(57) ABSTRACT

A semiconductor device and method is disclosed. In one embodiment, the semiconductor device includes a cavity housing and a sensor chip. In one embodiment, the cavity housing has an opening to the surroundings. The sensor region of the sensor chip faces said opening. The sensor chip is mechanically decoupled from the cavity housing. In one embodiment, the sensor chip is embedded into a rubber-elastic composition on all sides in the cavity of the cavity housing.

23 Claims, 3 Drawing Sheets

U.S. PATENT DOCUMENTS

| | | |
|---|---|---|
| 6,940,140 B1 * | 9/2005 | Ikeda et al. ......... 257/433 |
| 7,464,603 B2 * | 12/2008 | Bauer et al. ......... 73/754 |
| 2001/0055836 A1 * | 12/2001 | Kunda ......... 438/108 |
| 2006/0012016 A1 | 1/2006 | Betz et al. |
| 2006/0022338 A1 | 2/2006 | Meyer et al. |
| 2006/0126313 A1 | 6/2006 | Steiner et al. |

FOREIGN PATENT DOCUMENTS

| | | |
|---|---|---|
| DE | 102 38 581 | 3/2004 |
| DE | 10 2004 019 428 | 8/2005 |
| DE | 102 23 035 | 3/2007 |
| DE | 102 028 593 | 3/2007 |
| JP | 60136254 | 7/1985 |
| JP | 2002039887 | 2/2002 |
| JP | 2002107249 | 4/2002 |
| WO | 2004034472 | 4/2004 |

* cited by examiner

SEMICONDUCTOR DEVICE HAVING A SENSOR CHIP, AND METHOD FOR PRODUCING THE SAME

CROSS REFERENCE TO RELATED APPLICATION

This Utility Patent Application claims the benefit of the filing date of German Application No. DE 10 2004 043 663.0, filed Sep. 7, 2004, and International Application No. PCT/DE2005/001453, filed Aug. 18, 2005, both of which are herein incorporated by reference.

BACKGROUND

The invention relates to a semiconductor sensor device having a cavity housing and sensor chip, and to a method for producing the same.

A semiconductor sensor device having a cavity housing is known from the patent application DE 10 2004 019 428.9. Semiconductor sensor devices of this type have the problem that the sensor chip is fixed in the cavity housing by adhesive bonding by a material having a low modulus of elasticity in such a way that perturbing reactions of the mechanical loadings of the rigid cavity housing, such as thermal strains or vibration loadings, have an effect on the sensor chip and partly corrupt the measurement results. Sensor chips of this type in the cavity housing are protected from the surroundings by a soft material in order to protect at least the top side with the sensor region of the semiconductor sensor chip against additional loadings.

The reliability of the sensor chip also depends on the fluctuations of the quality of the adhesive with which the sensor chip is fixed on the base of the rigid cavity housing, with the result that resonant vibration of the sensor chip partly occurs, in particular during the fitting of bonding wires. As a result, manufacturing-dictated prior damage of the semiconductor chip or a reduced bonding quality cannot be precluded as a consequence, which impairs the reliability of the sensor chip. What is more, the different coefficients of thermal expansion of the materials used cause losses of yield on account of mechanical stresses in the sensor chip.

For these and other reasons, there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 2 illustrates a schematic cross section through a cavity housing.

FIG. 3 illustrates a schematic cross section through the cavity housing in accordance with FIG. 2 after the introduction of a lower region of a rubber-elastic composition.

FIG. 4 illustrates a schematic cross section through the cavity housing in accordance with FIG. 3 after the application of a sensor chip to the lower region of the rubber-elastic composition.

FIG. 5 illustrates a schematic cross section through the cavity housing in accordance with FIG. 4 after an electrical connection of the sensor chip to internal leads.

FIG. 6 illustrates a schematic cross section through the cavity housing in accordance with FIG. 5 after the application of an upper region of a rubber-elastic composition.

FIG. 7 illustrates a schematic cross section through the cavity housing in accordance with FIG. 6 after the removal of spacers from the base region of the cavity housing.

DETAILED DESCRIPTION

Figure 1:
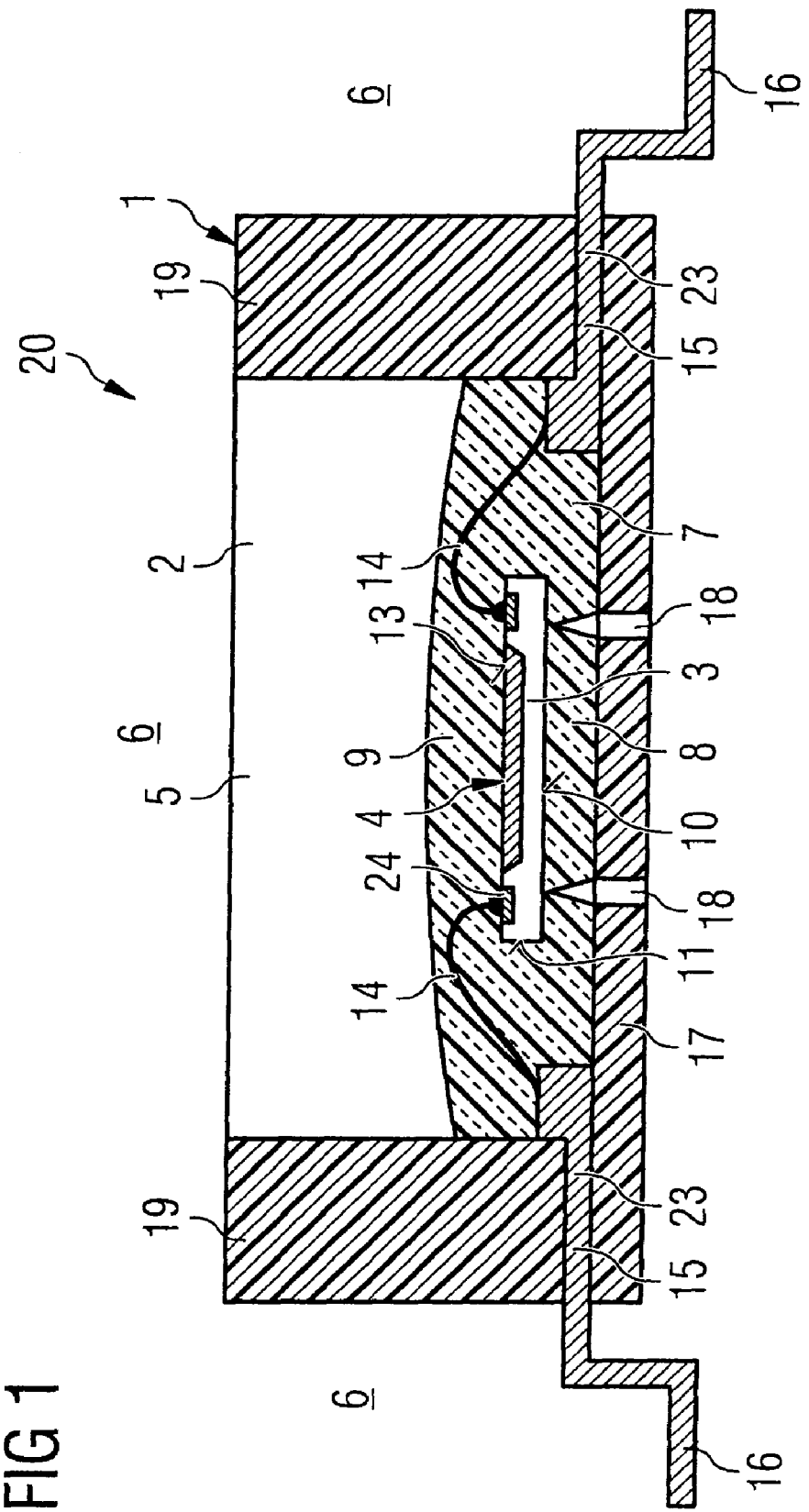
FIG. 1 illustrates a schematic cross section through a semiconductor sensor device in accordance with a first embodiment of the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One embodiment of the invention provides a semiconductor device having a cavity housing and a sensor chip, and also a method for producing the same, with the result that, on the one hand, the yield in the production of semiconductor sensor devices of this type is improved and, on the other hand, the reliability of semiconductor sensor devices of this type in daily measurement practice is increased.

In one embodiment, the invention provides a semiconductor sensor device having a cavity housing, wherein the sensor chip is arranged in the cavity of the housing. The sensor chip has a sensor region, which reacts to pressure fluctuations and/or temperature fluctuations. For this purpose, the cavity housing has an opening to the surroundings in order to permit parameters of the surroundings to act on the sensitive sensor region. The sensor region therefore faces the opening. The sensor chip itself is embedded into a rubber-elastic composition on all sides in the cavity of the housing.

In one or more embodiments, this semiconductor sensor device has an advantage that the sensor chip in the rubber-elastic composition that completely surrounds it is mechanically decoupled from the cavity housing. In principle, the sensor chip is only suspended from bonding wires which are only a few micrometers thick and which serve for transferring measurement signals to corresponding external contacts of the cavity housing. The bonding wires are embedded into an upper region of the rubber-elastic composition. Apart from this suspension in the rubber-elastic composition, no mechanical supports or points of contact whatsoever are provided in the cavity housing. Merely for mounting and transporting purposes it is possible, in one embodiment of the invention, for the semiconductor chip to be supported in the cavity housing by insertion of spacer pins through the base region of the cavity housing.

In principle, the rubber-elastic composition has two regions: a lower region below the sensor chip, on which a semiconductor frame of the sensor chip is arranged by its rear side, and an upper region, in which the edge sides and the top side of the sensor chip with the sensor region itself are embedded. These two regions are differentiated only during the production phase, in order to simplify the manufacture. These regions can no longer be differentiated after a semiconductor sensor device having a cavity housing and a sensor chip in the cavity housing has been completed, especially if the same rubber-elastic material is used for the lower region and the upper region.

An interface between the lower region and the upper region can be perceived only when the rubber-elastic compositions have different elastic constants for the lower region and the upper region of the sensor chip or have different colorations, which shall not be ruled out for embodiment in practice. In a further embodiment of the invention, the rubber-elastic composition is an optically transparent elastomer. The optically transparent elastomers have the advantage that the light sensitivity of the semiconductor sensor chip can also be used for specific measurement purposes. Should the sensor chip be photo-insensitive, however, then it is also possible to use rubber-elastic compositions including light-absorbing particles, such as carbon black particles.

In one embodiment, it is provided that the rubber-elastic composition has a silicone rubber. Silicone rubbers of this type have proved worthwhile as decoupling compositions between the rigid cavity housing of the semiconductor sensor device and the sensor chip.

In one or more embodiments, the sensor chip is electrically connected to external contacts of the semiconductor sensor device via bonding wires, as already mentioned above, and via through contacts through the cavity housing. In this case, the bonding wires can be embodied with a diameter of only a few micrometers and, consequently, support the mechanical decoupling of the rigid cavity housing and the rigid through contacts and also the external contacts from the sensor chip.

In one embodiment of the invention, the cavity housing has a base, which for its part has passage openings. The passage openings are arranged in such a way that the sensor chip can be mechanically supported on the one hand for transportation and for mounting by corresponding pins which are led through the opening in the base of the cavity housing. Moreover, the openings have the advantage that the sensor chip, during the bonding operation, that is to say during the production of the semiconductor device, can be mechanically supported by the openings and by corresponding supports and/or spacers in the bonding, thereby enabling a reliable bonding connection between bonding wire and contact areas at the top side of the sensor chip.

In one embodiment of the invention, the cavity housing has at least one base and side walls, which laterally delimit the cavity, wherein removable ends of spacers project from the base, which form an abutment for an arrangement and fitting of bonding wires on a sensor chip positioned on the ends of the spacers. This construction of the base is achieved technologically by the passage openings provided in the cavity base. The sensor chip—freed after the removal of the abutments for the bonding of the sensor chip—in the rubber-elastic composition is mechanically decoupled from the rigid cavity housing, with the result that its measured values are not impaired by the rigid cavity housing.

In a further embodiment of the invention, the spacers are pins which project through the base into the cavity. The pins are dimensioned in such a way that they exactly support the region of the sensor chip which is subjected to the greatest loading by the bonding. In order to fix the semiconductor chip on the spacers, the lower region of the rubber-elastic composition is already applied to the base, with the result that the semiconductor chip is held laterally with the aid of the rubber-elastic composition and is supported from below by the spacers.

A method for producing a semiconductor sensor having a cavity housing and a sensor chip with sensor region, the sensor chip being arranged in the cavity of the housing, has the following method processes. The first process involves producing a cavity housing with internal conductor tracks and external contacts and a cavity base, wherein the internal conductor tracks are connected to the external contacts via through contacts or via lead tracks. During the production of the cavity housing, both the cavity base and the side walls surrounding the cavity base are produced from a rigid plastic material in an injection-molding method.

During the injection-molding operation, ends of spacers which project from the cavity base are simultaneously cast into the cavity base, wherein the arrangement and size of the spacers are adapted to the areal extent of the semiconductor chip such that the ends of the spacers form abutments for an arrangement and fitting of bonding wires on a semiconductor chip that is to be positioned on the ends of the spacer. In the cavity housing, firstly the base of the cavity is then filled with a rubber-elastic composition as a lower region to an extent such that at least the spacers are encapsulated by the rubber-elastic composition as far as their ends.

The sensor chip is then applied by its rear side to the ends of the spacers with fixing of the sensor chip with the aid of the rubber-elastic composition. Afterward, bonding wires are bonded onto corresponding contact areas on the top side of the sensor chip opposite to the ends of the spacers and are fitted onto corresponding contact pads of internal leads of the cavity housing. Bonding wires and the sensor chip are then embedded into the rubber-elastic composition by application of an upper region of the rubber-elastic composition, which encapsulates both the edge sides of the sensor chip and the sensor region of the sensor chip. The spacers can then be removed from the base with formation of passage openings in the base of the cavity housing.

This method has the advantage that the spacers can mechanically support the sensor chip for as long as is necessary for the production method, for example in the bonding process, or for the transporting and mounting of the sensor chip at its site of use. The spacers, as described above in the method, can then be removed at any time in order to mechanically decouple the sensor chip completely from the rigid cavity housing, in order to increase its sensor sensitivity and reliability.

In one embodiment, in order to produce a cavity housing with internal conductor tracks and external contacts, a leadframe with a plurality of housing positions is produced. The side walls and the base with cast-in spacers in the housing positions are produced by injection-molding technology in such a way that for this purpose the spacers are positioned in an injection mold prior to the injection molding. This method variant has the advantage that no holes have to be made through the housing base subsequently for the positioning of the spacers, rather, in a single injection-molding process, both the external contacts and the internal leads and the spacers required for the spacer mounting are all already prepositioned in the injection mold and thus produce a cavity housing which can be stamped out from the leadframe after the completion of the latter.

In one embodiment of the invention, the leadframe itself has the spacers, that is to say that the spacers are fixedly connected to the leadframe, so that the spacers can be removed after the injection-molding operation, and after the positioning of the sensor chip and its connection to the internal leads, with the leadframe from the completed semiconductor device. The possibility of leaving the spacers as support for the sensor chip in the housing until this semiconductor sensor device is used at its site of use is not applicable in this case. However, there is the possibility of introducing transporting spacers into the cavity housing base after the removal of the spacers from the leadframe.

The filling of the base in the cavity of the cavity housing both for the lower region and for the upper region with a rubber-elastic composition is carried out by a dispensing technology. This technology has the advantage that it embeds the sensor chip with the bonding wires into a rubber-elastic composition in an extremely gentle fashion. A thermocompression or thermosonic bonding has proved worthwhile as a method for the fitting of bonding wires on contact areas of the sensor chip. The removal of the spacers may also be effected by etching technology if the possibility of removing the spacers from the base region of the rigid cavity housing without damaging the sensor chip is precluded. In the case of the etching technology, the etching solution is coordinated with the metal of the spacers without the external contacts being incipiently etched or the rubber-elastic composition being damaged in the process.

To summarize, it can be established that with the present invention, pins are inserted into the housing in order to stabilize the sensor chip during manufacture, transporting and mounting. As a result, an extremely soft rubber-elastic material can be used as chip adhesive. The sensor chip itself cannot start vibrating during wire bonding, however, since the pins support it. Finally, the pins can be removed again from the housing, which can be made dependent on whether or not this is to take place actually prior to transporting and mounting.

What is achieved with this invention is that

1. The chip can be completely embedded into an extremely soft rubber-elastic material and is therefore also mechanically decoupled completely from the rigid cavity housing.
2. A single rubber-elastic material is used both for the fixing of the sensor chip on the spacers and for the embedding of the sensor chip.
3. During the use of the semiconductor sensor device, no direct mechanical forces act on the sensor chip and in particular on the sensor diaphragm in the sensor region.
4. The required mechanical stability is on the other hand achieved by pins or by spacers for the wire bonding.
5. The pins as function of a defined spacer can temporarily remain in the device or can be removed again from the base region of the cavity housing directly after the wire bonding and the chip potting.
6. A complete mechanical decoupling of pressure sensor chips is achieved by the concept according to the invention for the chip fixing during the loadings due to the wire bonding.

The invention will now be explained in more detail with reference to the accompanying figures.

FIG. 1 illustrates a schematic cross section through a semiconductor sensor device 20 in accordance with one embodiment of the invention. The semiconductor sensor device 20 has a cavity housing 1. The cavity 2 of the cavity housing 1 is open toward the top, as illustrated in FIG. 1. This opening 5 enables the semiconductor sensor device 20 to maintain a physical connection to the surroundings 6. Therefore, the sensor region 4 of a sensor chip 3, which is arranged in the cavity 2 of the cavity housing 1, faces the opening 5. The sensor chip 3 is embedded into a rubber-elastic composition 7 on all sides in the cavity 2 of the cavity housing 1.

As a result of the construction of the semiconductor sensor device 20, the rigid cavity housing 1 is mechanically decoupled from the sensor chip 3 by the embedding of the sensor chip 3 into a rubber-elastic composition 7 surrounding it on all sides. Consequently, the different coefficients of expansion of the different materials of the cavity housing 1, of the electrical leads and of the sensor chip 1 cannot lead to thermal strains since these different expansions during thermal loadings are compensated for by the rubber-elastic composition 7 or not transferred to the sensor chip. Vibration loadings for the rigid cavity housing 1 are also able to affect the sensor chip only in a limited manner or in a greatly damped manner. This results in a higher reliability of the semiconductor sensor device 20 compared with conventional semiconductor sensor devices.

The rubber-elastic composition 7 is identified uniformly in FIG. 1, but it includes two regions. A lower region 8 is principally arranged below the sensor chip 3 and covers the rear side 10 of the sensor chip. An upper region 9 of the rubber-elastic composition 7 is principally arranged on the top side 13 of the sensor chip 3 and partly covers the edge sides 11 and 12 of the sensor chip and embeds bonding wires 14, from which the sensor chip is suspended by its contact areas 24, into the rubber-elastic composition 7.

A sensor region 4 is arranged centrally in the center of the sensor chip 3, while the bonding wires 14 end on the edge regions of the sensor chip. The bonding wires 14 have a cross section which is only a few micrometers in its radius, with the result that the bonding wires themselves constitute the sole mechanical and electrical connection to the rigid cavity housing 1. For this purpose, the bonding wires 14 are bonded onto internal lead tracks 23, with the result that measurement signals can be conducted from the sensor chip 3 via the bonding wires 14 to the internal lead tracks 23 and from there via through contacts 15 to external contacts 16.

The base 17 of the cavity housing 1 has passage openings 18, which also extend through the lower region 8 of the rubber-elastic composition 7. Spacers can be introduced into the passage openings 18 for transporting and mounting, in order to ensure the position of the sensor chip during transporting and mounting. Only after mounting has taken place in the region of use of the semiconductor sensor device 20 can the spacers then be removed from the base 17 of the cavity housing 1, whilst releasing the sensor chip. In this embodiment of the invention, the base 17 is surrounded by side walls 19, through which the through contacts 15 pass the signals outwardly to the external contacts 16.

FIGS. 2 to 7 illustrate schematic cross sections through a cavity housing 1 during different production phases of a semiconductor sensor device 20. Components having the same functions as in FIG. 1 are identified by the same reference symbols and are not discussed separately in the subsequent FIGS. 2 to 7.

Figure 2:
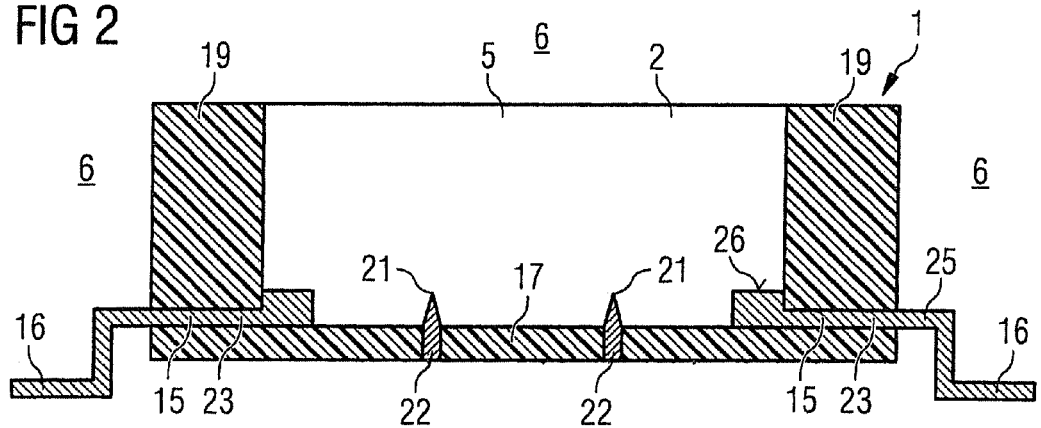
FIGS. 2 to 7 illustrate schematic cross sections through a cavity housing during different production phases of a semiconductor sensor device.

FIG. 2 illustrates a schematic cross section through a cavity housing 1. The cavity housing 1 is constructed from a plastic housing composition 27 and has a base 17 and side walls 19 which surround the base 17 and in which leads 25 are anchored. The leads 25 are part of a leadframe having a plurality of cavity housing positions. A cavity housing 1 of this type is molded in each of the cavity housing positions with the aid of an injection-molding method. The cavity housing 1 present here has spacers 22 cast into the cavity base 17, which here have the form of pins with pointed tapering ends 21 of the spacers 22. The spacers 22 are arranged in the cavity base such that their ends 21 project into the cavity 2 above the level of the cavity base and are able to support and space apart a sensor chip 3 during bonding, during transporting and/or during mounting. At the side walls 19, internal conductor tracks 23 are situated in the base region, and merge into coated bonding areas 26 in the cavity. The bonding areas 26 are electrically connected to the external contacts 16 via through contacts 15.

Figure 3:
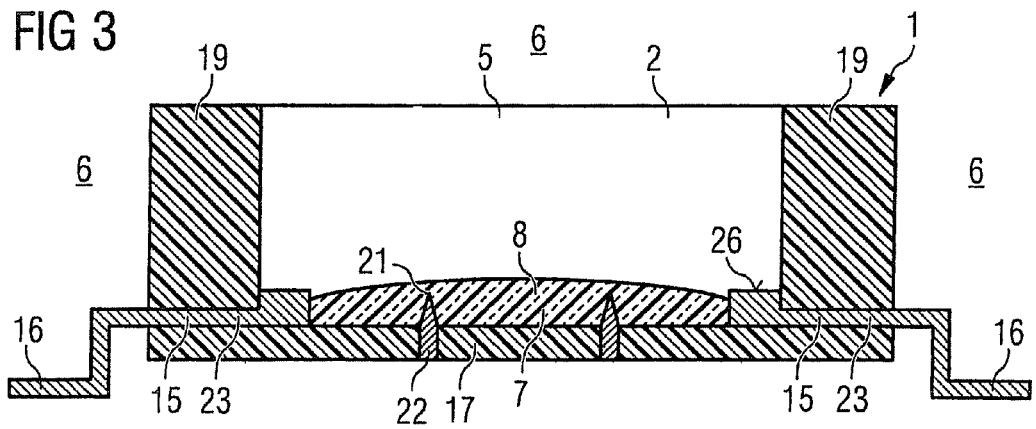

FIG. 3 illustrates a schematic cross section through the cavity housing 1 in accordance with FIG. 2 after the introduction of a lower region of the rubber-elastic composition 7. In this case, the rubber-elastic composition 7 is kept in a highly viscous state, so that a sensor chip can be molded into the lower region 8 of the rubber-elastic composition 7 until it touches the ends 21 of the spacers 22.

Figure 4:
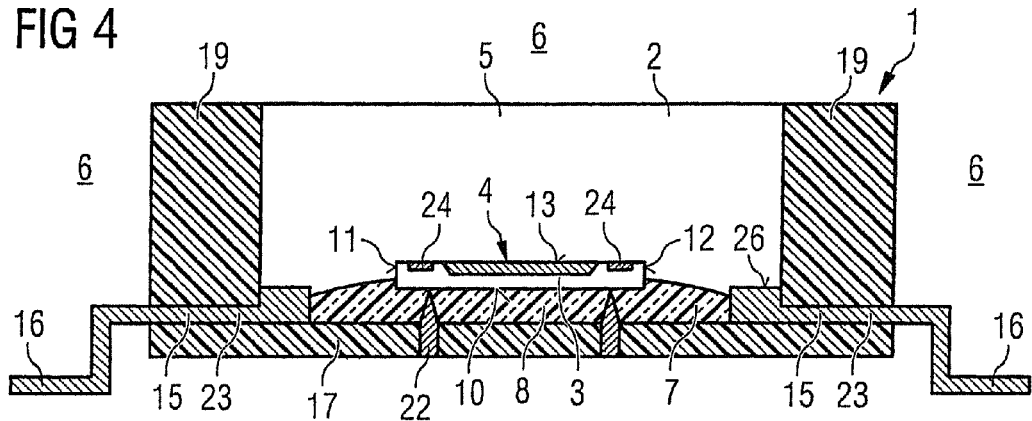

FIG. 4 illustrates a schematic cross section through the cavity housing 1 in accordance with FIG. 3 after the application of a sensor chip 3 to the lower region 8 of the rubber-elastic composition 7. In this case, the rear side 10 of the sensor chip 3 bears adhesively on the ends 21 of the spacers 22 which are arranged in the base 17 of the cavity housing 1. By the rubber-elastic composition 7 displaced toward the edge sides 11 and 12, the sensor chip 3 is also fixed in the horizontal spatial directions, with the result that secure bonding of bonding wires on the contact areas 24 of the sensor chip 3 is possible.

Figure 5:
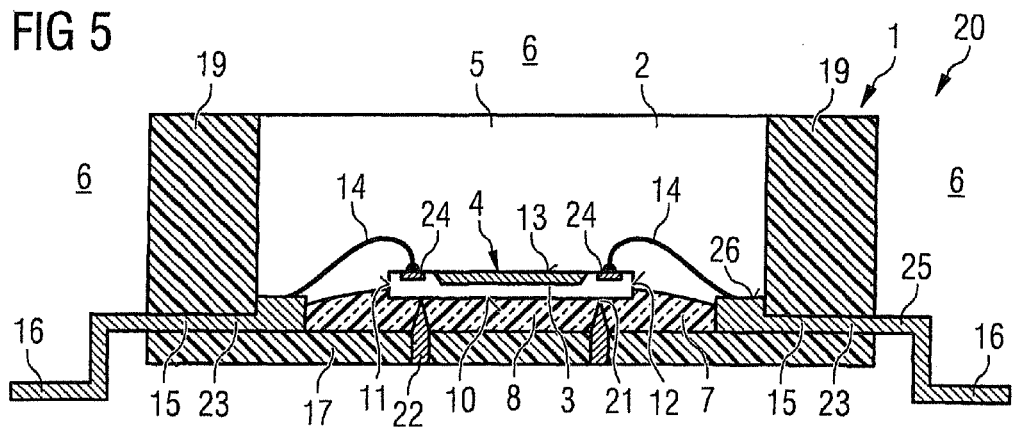

FIG. 5 illustrates a schematic cross section through the cavity housing 1 in accordance with FIG. 4 after an electrical connection of the sensor chip to internal leads 25. For this purpose, the bonding wires 14 are bonded on the contact areas 24 of the sensor chip 3 by a bonding stylus and the bonding wires 14 are subsequently fitted on the bonding areas 26 of the leads 25 in the cavity housing 1. During bonding, which constitutes a loading for the sensor chip 3, the sensor chip 3 is supported by the spacers 22, which project from the base 17 of the cavity housing 1, in such a way that reliable bonding connections arise between the contact areas 24 of the sensor chip 3 and the bonding wires 14.

Figure 6:
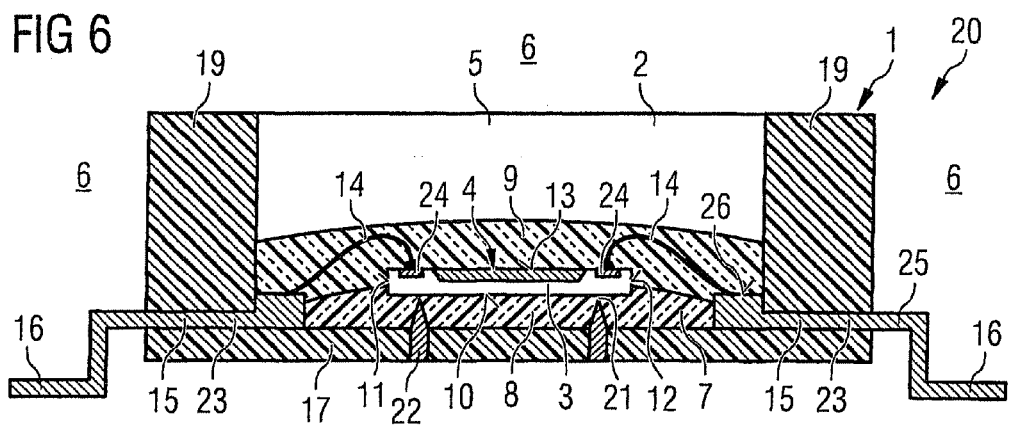

FIG. 6 illustrates a schematic cross section through the cavity housing 1 in accordance with FIG. 5 after the application of the upper region 9 of a rubber-elastic composition 7. In this case, the bonding wires 14, the edge sides 11 and 12 of the semiconductor chip 3 and the top side 13 of the semiconductor chip 3 are embedded into the rubber-elastic composition 7. Consequently, the sensor chip 3 is now completely surrounded by a rubber-elastic composition, and only the spacers 22 provide for a mechanical coupling to the rigid cavity housing 1. The coupling can be retained until the transporting and mounting of the semiconductor sensor device 20 have been concluded. The spacers 22 can then be removed from the base 17.

Figure 7:
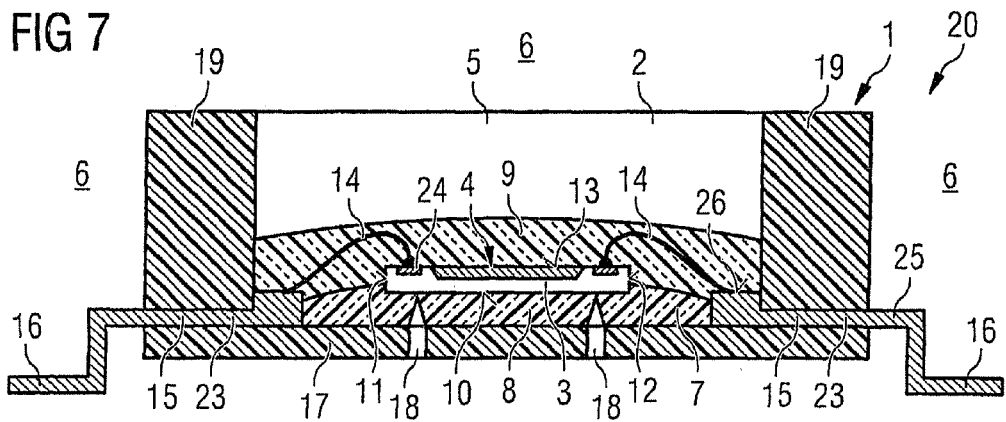

FIG. 7 illustrates a schematic cross section through the cavity housing 1 in accordance with FIG. 6 after the removal of the spacers 22 from the base 17 of the cavity housing 1. The schematic cross section through the semiconductor device 20 of FIG. 7 now corresponds to the schematic cross section already illustrated in FIG. 1.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device having a sensor comprising:
   a cavity housing;
   a sensor chip with a sensor region, the sensor chip being arranged in the cavity of the housing, wherein the cavity housing has an opening to the surroundings, and the sensor region faces the opening; and
   wherein the sensor chip is embedded into a rubber-elastic composition on all sides in the cavity of the housing.

2. The semiconductor device of claim 1, comprising:
   wherein the rubber-elastic composition comprises:
      a lower region below the sensor chip, on which the rear side of the sensor chip is arranged; and
      an upper region, into which edge sides and a top side of the sensor chip with the sensor region are embedded.

3. The semiconductor device of claim 1, comprising wherein the rubber-elastic composition includes an optically transparent elastomer.

4. The semiconductor device of claim 1, comprising wherein the rubber-elastic composition includes silicone rubber.

5. The semiconductor device of claim 1, comprising wherein the sensor chip is electrically connected to external contacts of the semiconductor sensor device via bonding wires and through contacts through the cavity housing.

6. The semiconductor device of claim 1, comprising wherein the cavity housing has a base, which for its part has passage openings.

7. The semiconductor device of claim 1, the cavity housing comprising:
   wherein the cavity housing has at least one base and side walls, which delimit the cavity, wherein removable ends of spacers project from the base, which form an abutment for an arrangement and fitting of bonding wires on a sensor chip positioned on the ends of the spacers.

8. The semiconductor device of claim 7, comprising wherein the spacers are pins which project through the base into the cavity.

9. The semiconductor sensor device of claim 7, comprising wherein the ends of the spacers which project from the base are encapsulated by the rubber-elastic composition.

10. A method for producing a semiconductor device comprising:
   defining a cavity housing and a sensor chip with sensor region, the sensor chip being arranged in a cavity of the cavity housing;
   producing the cavity housing with internal conductor tracks and external contacts and a cavity base, and also side walls surrounding the cavity base, and ends of spacers which project from the cavity base, wherein the arrangement and size of the spacers are adapted to the areal extent of the rear side of a sensor chip such that the ends of the spacers form abutments for an arrangement and fitting of bonding wires on a sensor chip positioned on the ends of the spacers;
   filling the base of the cavity of the cavity housing with a rubber-elastic composition at least as far as the ends of the spacers;
   applying a sensor chip by its rear side to the ends of the spacers with fixing of the sensor chip on the rubber-elastic composition;
   fitting bonding wires on contact areas of the sensor chip;
   embedding the bonding wires and the sensor chip into the rubber-elastic composition; and removing the spacers from the base with formation of passage openings in the base of the cavity housing.

11. The method of claim 10, comprising:
wherein in order to produce a cavity housing with internal conductor tracks and external contacts, producing a lead frame with a plurality of housing positions, wherein the side walls and the base with cast-in spacers in the housing positions are produced by means of injection-molding technology and for this purpose the spacers are positioned in an injection mold prior to the injection molding.

12. The method of claim 10, comprising wherein the lead frame has spacers, which are removed after the injection-molding operation with the lead frame from the completed semiconductor sensor devices.

13. The method of claim 10, comprising wherein the filling of the base of the cavity of the cavity housing with a rubber-elastic composition is effected by using a dispensing technology.

14. The method of claim 10, comprising wherein the fitting of bonding wires on contact areas of the sensor chip is effected by thermocompression or thermosonic bonding.

15. The method of claim 10, comprising wherein the removal of the spacers is effected by using an etching technology.

16. An integrated circuit having a semiconductor device comprising:
a cavity housing;
a sensor arranged in the cavity housing, mechanically decoupled from the cavity housing,
the sensor comprising a sensor chip,
wherein the sensor chip is mechanically decoupled from the cavity housing by being embedded into a rubber-elastic composition in the cavity housing.

17. The integrated circuit of claim 16, comprising:
the sensor chip having a sensor region, wherein the cavity housing has an opening to the surroundings, and the sensor region faces the opening.

18. The integrated circuit of claim 16, comprising:
wherein the rubber-elastic composition comprises:
a lower region below the sensor chip, on which the rear side of the sensor chip is arranged; and
an upper region, into which edge sides and a top side of the sensor chip with the sensor region are embedded.

19. The integrated circuit of claim 16, comprising wherein the rubber-elastic composition includes silicone rubber.

20. The integrated circuit of claim 16, comprising wherein the sensor chip is electrically connected to external contacts of the semiconductor sensor device via bonding wires and through contacts through the cavity housing.

21. The integrated circuit of claim 16, the cavity housing comprising:
wherein the cavity housing has at least one base and side walls, which delimit the cavity, wherein removable ends of spacers project from the base, which form an abutment for an arrangement and fitting of bonding wires on a sensor chip positioned on the ends of the spacers.

22. The integrated circuit of claim 21, comprising wherein the spacers are pins which project through the base into the cavity, wherein the ends of the spacers which project from the base are encapsulated by the rubber-elastic composition.

23. An integrated circuit having a semiconductor device comprising:
a cavity housing;
a sensor arranged in the cavity housing; and
means for mechanically decoupling the sensor from the cavity housing.

* * * * *